United States Patent
Refai-Ahmed et al.

(10) Patent No.: US 9,385,055 B2
(45) Date of Patent: Jul. 5, 2016

(54) STACKED SEMICONDUCTOR CHIPS WITH THERMAL MANAGEMENT

(75) Inventors: Gamal Refai-Ahmed, Markham (CA); Michael Z. Su, Round Rock, TX (US); Bryan Black, Spicewood, TX (US); Maxat Touzelbaev, San Jose, CA (US); Yizhang Yang, Sunnyvale, CA (US)

(73) Assignees: ATI Technologies ULC, Markham (CA); Advanced Micro Devices, Inc., Sunnyvale, CA (US)

( * ) Notice: Subject to any disclaimer, the term of this patent is extended or adjusted under 35 U.S.C. 154(b) by 1132 days.

(21) Appl. No.: 12/860,156

(22) Filed: Aug. 20, 2010

(65) Prior Publication Data

US 2012/0043668 A1 Feb. 23, 2012

(51) Int. Cl.
| | |
|---|---|
| *H01L 23/48* | (2006.01) |
| *H01L 23/04* | (2006.01) |
| *H01L 23/367* | (2006.01) |
| *H01L 23/42* | (2006.01) |
| *H01L 25/065* | (2006.01) |
| *H01L 21/56* | (2006.01) |
| *H01L 23/10* | (2006.01) |
| *H01L 23/498* | (2006.01) |

(52) U.S. Cl.
CPC .............. *H01L 23/04* (2013.01); *H01L 23/367* (2013.01); *H01L 23/42* (2013.01); *H01L 25/0652* (2013.01); *H01L 25/0657* (2013.01); H01L 21/563 (2013.01); H01L 23/10 (2013.01); H01L 23/49827 (2013.01); H01L 2224/16225 (2013.01); *H01L 2224/73204* (2013.01); *H01L 2224/73253* (2013.01); *H01L 2225/06513* (2013.01); *H01L 2225/06517* (2013.01); *H01L 2225/06562* (2013.01); *H01L 2225/06575* (2013.01); *H01L 2225/06589* (2013.01); *H01L 2924/10253* (2013.01); *H01L 2924/15311* (2013.01)

(58) Field of Classification Search
USPC .................. 257/777, E23.169, 723, 713, 686
See application file for complete search history.

(56) References Cited

U.S. PATENT DOCUMENTS

| | | | |
|---|---|---|---|
| 5,761,044 A * | 6/1998 | Nakajima | ....................... 361/719 |
| 6,285,559 B1 * | 9/2001 | Fukiharu | ....................... 361/760 |
| 7,112,884 B2 | 9/2006 | Bruno | |
| 7,198,980 B2 | 4/2007 | Jiang et al. | |
| 7,518,226 B2 * | 4/2009 | Cablao et al. | .................. 257/686 |
| 2005/0121757 A1 * | 6/2005 | Gealer | ............................ 257/678 |
| 2005/0127489 A1 * | 6/2005 | Mallik et al. | .................... 257/686 |
| 2005/0167798 A1 | 8/2005 | Doan | |

* cited by examiner

*Primary Examiner* — Wael Fahmy
*Assistant Examiner* — Sarah Salerno
(74) *Attorney, Agent, or Firm* — Timothy M. Honeycutt

(57) ABSTRACT

A method of assembling a semiconductor chip device is provided that includes placing an interposer on a first semiconductor chip. The interposer includes a first surface seated on the first semiconductor chip and a second surface adapted to thermally contact a heat spreader. The second surface includes a first aperture. A second semiconductor chip is placed in the first aperture.

17 Claims, 4 Drawing Sheets

STACKED SEMICONDUCTOR CHIPS WITH THERMAL MANAGEMENT

BACKGROUND OF THE INVENTION

1. Field of the Invention

This invention relates generally to semiconductor processing, and more particularly to thermal management structures for stacked semiconductor chips and to methods of assembling the same.

2. Description of the Related Art

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material fully contacts both the upper surface of the integrated circuit and the portion of the lower surface of the lid that overlies the integrated circuit. Conventional thermal interface materials include various types of pastes, and in some cases, a metal. Gel-type thermal interface materials consist of a polymeric matrix interspersed with thermally conductive particles, such as aluminum. More recently, designers have begun to turn to solder materials as a thermal interface material, particularly for high power-high temperature chips.

A solder thermal interface material like indium has favorable thermal properties that work well for high power-high temperature die. However, indium exhibits relatively poor adhesion to silicon. To facilitate bonding with indium, the backside of a silicon die may be provided with a metallization stack that includes a layer that readily adheres to silicon, a layer that readily wets indium and perhaps one or more intermediary barrier or other layers. An entire wafer of dice may be provided with respective metallization stacks en masse prior to dicing. To establish favorable thermal contact between a conventional solder thermal interface material and the semiconductor chip and lid that bracket it, a reflow process is performed to wet the applicable surfaces.

Stacked dice present an additional technical challenge for integration of both solder and organic thermal interface materials. A stacked dice arrangement is non-planar relative to the underlying package substrate, yet thermal contact between the solder thermal interface material, each chip and the lid is often desired. The non-planarity can lead to inadequate thermal pathways to dissipate heat from the lowermost chip in the stack. This can limit the power and size for the lowermost die.

The present invention is directed to overcoming or reducing the effects of one or more of the foregoing disadvantages.

SUMMARY OF EMBODIMENTS OF THE INVENTION

In accordance with one aspect of an embodiment of the present invention, a method of assembling a semiconductor chip device is provided that includes placing an interposer on a first semiconductor chip. The interposer includes a first surface seated on the first semiconductor chip and a second surface adapted to thermally contact a heat spreader. The second surface includes a first aperture. A second semiconductor chip is placed in the first aperture.

In accordance with another aspect of an embodiment of the present invention, a method of assembling a semiconductor chip device is provided that includes placing a first semiconductor chip on a second semiconductor chip. The second semiconductor chip includes a surface and a first footprint. The first semiconductor chip is positioned on the first surface and covers a first portion but not a second portion of the first surface of the second semiconductor chip. An interposer is placed on the second portion of the first surface. The interposer includes a surface adapted to thermally contact a heat spreader and has a second footprint that does not extend beyond the first footprint of the second semiconductor chip.

In accordance with another aspect of an embodiment of the present invention, an apparatus is provided that includes a first semiconductor chip and an interposer that includes a first surface seated on the first semiconductor chip and a second surface adapted to thermally contact a heat spreader. The second surface includes a first aperture. A second semiconductor chip is positioned in the first aperture.

In accordance with another aspect of an embodiment of the present invention, an apparatus is provided that includes a first semiconductor chip that has a first surface and a first footprint. A second semiconductor chip is positioned on the first surface and covers a first portion but not a second portion of the first surface. An interposer is positioned on the second portion of the first surface. The interposer includes a surface adapted to thermally contact a heat spreader and has a second footprint that does not extend beyond the first footprint of the first semiconductor chip.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various stacked semiconductor chip arrangements are disclosed. The disclosed embodiments incorporate an interposer for establishing a thermally conductive pathway from a lower level semiconductor chip to a heat spreader. One exemplary interposer includes an aperture to receive a stacked semiconductor chip. Another exemplary interposer is designed to occupy space on a lower level semiconductor not otherwise covered. Additional details will now be described.

Figure 1:
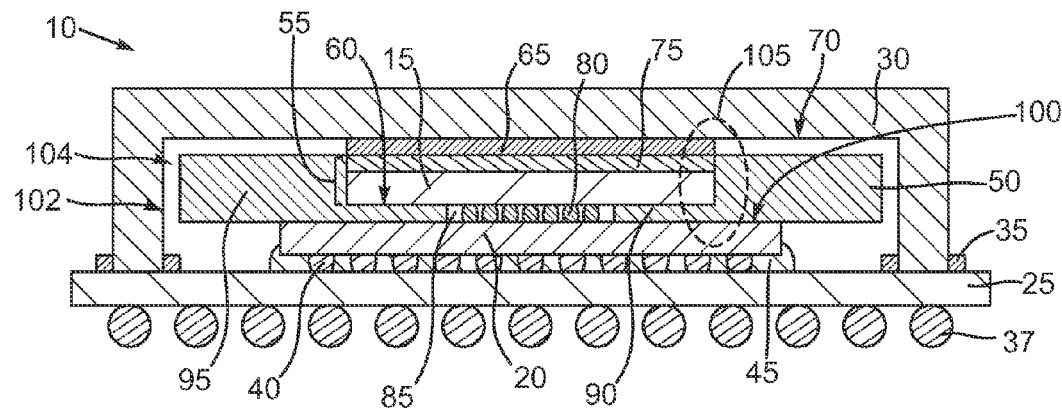
FIG. 1 is a sectional view of an exemplary embodiment of a semiconductor chip device that incorporates stacked semiconductor chips.

In the drawings described below, reference numerals are generally repeated where identical elements appear in more than one figure. Turning now to the drawings, and in particular to FIG. 1, therein is shown a sectional view of an exemplary embodiment of a semiconductor chip device 10 that incorporates stacked semiconductor chips. In this illustrative embodiment, the semiconductor chip device 10 includes a semiconductor chip 15 stacked on a semiconductor chip 20. The semiconductor chip 20 is, in turn, mounted on a circuit board 25. The semiconductor chips 15 and 20 may be covered by a heat spreader or lid 30, which may be secured to the circuit board 25 by way of an adhesive 35 or other fastening techniques. The semiconductor chips 15 and 20 may be any of a myriad of different types of circuit devices used in electronics, such as, for example, microprocessors, graphics processors, combined microprocessor/graphics processors, application specific integrated circuits, memory devices, active optical devices, such as lasers, or the like, and may be single or multi-core or even stacked laterally with additional dice. The semiconductor chips 15 and 20 may be constructed of bulk semiconductor, such as silicon or germanium, or semiconductor on insulator materials, such as silicon-on-insulator materials.

The circuit board 25 may be a semiconductor chip package substrate, a circuit card, or virtually any other type of printed circuit board. Although a monolithic structure could be used for the circuit board 25, a more typical configuration will utilize a buildup design. In this regard, the circuit board 25 may consist of a central core upon which one or more buildup layers are formed and below which an additional one or more buildup layers are formed. The core itself may consist of a stack of one or more layers. If implemented as a semiconductor chip package substrate, the number of layers in the circuit board 25 can vary from four to sixteen or more, although less than four may be used. So-called "coreless" designs may be used as well. The layers of the circuit board 25 may consist of an insulating material, such as various well-known epoxies, interspersed with metal interconnects. A multi-layer configuration other than buildup could be used. Optionally, the circuit board 25 may be composed of well-known ceramics or other materials suitable for package substrates or other printed circuit boards. The circuit board 25 is provided with a number of conductor traces and vias and other structures (not visible) in order to provide power, ground and signals transfers between the semiconductor chips 15 and 20 and another device, such as another circuit board for example. The circuit board 25 may be electrically connected to another device (not shown) by way of an input/output array such as the ball grid array depicted. The ball grid array includes plural solder balls 37 metallurgically bonded to respective ball pads (not shown). The ball pads (not shown) are interconnected to various conductor pads in the semiconductor chip 20 by way of plural interconnect traces and vias and other structures that are not shown. Optionally, other types of interconnects may be used for the circuit board 25, such as pin grid arrays, land grid arrays or other types of interconnect structures.

The lid 30 may be a bath tub design as depicted, a top hat design or some other configuration as desired. The lid 30 may be composed of well-known ceramics or metallic materials as desired. Some exemplary materials include nickel plated copper, anodized aluminum, aluminum-silicon-carbon, aluminum nitride, boron nitride or the like. The adhesive 35 used to secure the lid 30 may be composed of a well-known thixotropic adhesive, an epoxy, another type of polymer or even a solder.

The semiconductor chip 20 may be electrically connected to the circuit board 25 by way of plural interconnect structures 40, which may be solder joints, conductive pillars, or other interconnect structures. An underfill material layer 45 may be applied to the interface between the semiconductor chip 20 and the circuit board 25 in order to lessen the effects of differential CTE.

An exemplary thermal management scheme for the exemplary semiconductor chip device 10 will now be described. The semiconductor chip 15 is not seated directly on the semiconductor chip 20. Rather, an interposer 50 is seated on the semiconductor chip 20 and the semiconductor chip 15 is seated in an aperture 55 of the interposer 50. The aperture 55 defines an upwardly facing seating surface 60 upon which the semiconductor chip 15 is positioned. To facilitate heat transfer from the semiconductor chips 15 and 20 to the lid 30, a thermal interface material layer 65 may be positioned between the semiconductor chip 15 and the underside 70 of the lid 30. The thermal interface material 65 may be a thermal gel, a thermal grease, a solder or the like. If a solder is selected, exemplary materials include indium, indium solder, tin-silver, bismuth-tin, other tin solders, gallium plus a polymer or the like. In the event that the thermal interface material 65 is composed of a solder, such as indium, then the semiconductor chip may be provided with a backside metallization structure 75 that is designed to readily wet to the thermal interface material 65. A variety of materials may be used for the backside metallization 75, depending on the composition of the lid underside 70, and the semiconductor chip 15. In one exemplary embodiment, the backside metallization 75 may consist of a laminate such as an aluminum film formed on the semiconductor chip 15, a titanium film formed on the aluminum film, a nickel-vanadium film formed on the titanium film and a gold film formed on the nickel-vanadium film. The aluminum film provides advantageous adhesion with silicon. The titanium film provides a barrier layer to prevent gold and indium from migrating into the semiconductor chip 15 and to facilitate adhesion with the nickel-vanadium film, and the nickel-vanadium film provides desirable adhesion with gold and a barrier to inhibit diffusion into the titanium layer. The gold film provides a desirable wetting surface for indium. It should be understood that the thermal interface material 65 and the back side metallization 75 are not depicted strictly to scale with regard to the other structures of the semiconductor chip device 10 for ease of readability.

The semiconductor chip 15 may be electrically interfaced with the semiconductor chip 20 by a variety of mechanisms. In this illustrative embodiment, plural interconnect structures 80 may electrically connect the semiconductor chip 15 to the semiconductor chip 20. The interconnect structures 80 may be conductive bumps, conductive pillars or other types. Exemplary materials include solders, copper, silver, platinum, gold, aluminum, palladium, alloys of these or the like. In order to accommodate the interconnect structures 80 spatially, a suitable aperture 85 is formed in the interposer 50. Of course, it should be understood that the semiconductor chips 15 and 20 may be provided with plural conductor pads or other conductor structures (not visible) that are designed to interface metallurgically with the various interconnect structures 40 and 80.

The aperture 55 in the interposer 50 defines a relatively thinner floor portion 90 and a thicker peripheral portion 95. A thermally conductive pathway from the semiconductor chip 20 to the lid 30 consists of the interface 100 between the interposer 50 and the semiconductor chip 20, the seating surface 60 of the thin portion 90, the semiconductor chip 15 itself, the optional backside metallization structure 75 and the thermal interface material 65. The thick portion 95 of the interposer 50 extends beyond the lateral boundary of the semiconductor chip 20 but not to the sidewall 102 of the lid 30. This arrangement leaves a gap 104, which facilitates lateral thermal expansion and ease of mounting of the lid 30. The size of the gap 104 can be varied.

Figure 2:
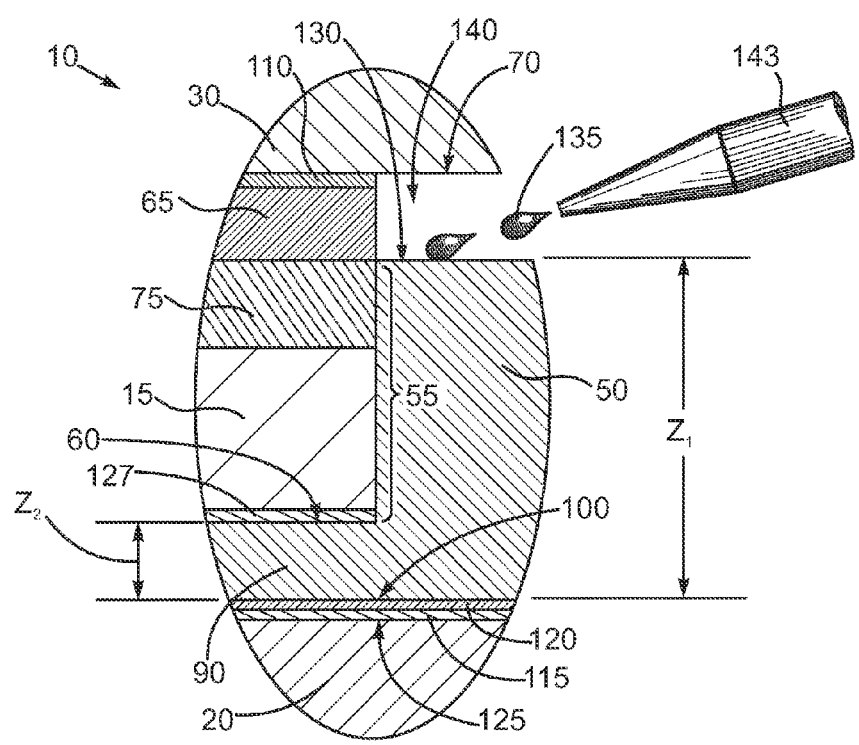
FIG. 2 is a portion of FIG. 1 shown at greater magnification.

Additional details of the semiconductor chip device 10 may be understood by referring now also to FIG. 2, which is the portion of FIG. 1 circumscribed by the dashed oval 105 shown at greater magnification. Note that because of the location of the dashed oval 105, a small portion of the lid 30, the thermal interface material 65, the backside metallization 75, the semiconductor chip 15, the semiconductor chip 20, and the interposer 50 are visible. In particular, a small portion of the thinned portion 90 of the interposer 50 is visible along with the interface 100 between the semiconductor chip 20 and the interposer 50. If the lid 30, and in particular the underside 70 thereof, will not readily wet metallurgically with the thermal interface material 65, then a wetting film 110 may be applied to the underside 70 to facilitate the metallurgical bonding. The composition of the wetting film 110 will depend upon the compositions of the lid 30 and the thermal interface material 65. For example, where the thermal interface material 65 is composed of indium or alloys thereof, gold or platinum may be suitable materials for the wetting film 110. The interposer 50 may be secured to the semiconductor chip 20 by way of an adhesive material 115 which is advantageously composed of some form of non-conducting polymer material. Various epoxies or other polymers may be used, such as benzocyclobutene (BCB). Since the interposer 50 is not composed of an electrically conducting material and since the adhesive layer 115 is advantageously composed of a non-conducting polymer, surface level electrical traces or routing such as the exemplary trace 120 may be provided on the surface 125 of the semiconductor chip 20. This provides an advantageous flexibility in terms of electrical routing for the semiconductor chip 20. There may be many such electrical routing traces 120 provided at various locations on the surface 125 of the semiconductor chip 20. The semiconductor chip 15 may be secured to the seating surface 60 of the interposer by an adhesive 127, which may be like in composition to the adhesive 115.

The thickness $Z_1$, of the interposer, the thickness $Z_2$, of the thin portion 90 and the depth of the aperture 55, given by $Z_1$-$Z_2$, should be selected to account for the thickness of the semiconductor chip 15 with or without the optional backside metallization 75 as well as all the other structures and films positioned between the surface 125 of the semiconductor chip 25 and the underside 70 of the lid 30. One rule of thumb that may be applied is to select the thickness $Z_2$, of the thin portion 90 to be about 70% of the gap between the semiconductor chip 15 and the semiconductor chip 20. It is contemplated that more than one semiconductor chip may be stacked on the semiconductor chip 20. If so, then the thickness $Z_1$, and the depth $Z_1$-$Z_2$, should be tailored accordingly.

Even better thermal management of heat dissipated from the semiconductor chips 15 and 20 may be provided by establishing thermal contact between an upper surface 130 of the interposer 50 and the underside 70 of the lid 30. This may be accomplished by depositing a thermal interface material 135 in the gap 140 between the surface 130 of the interposer 50 and the underside 70 of the lid 30. Here, the thermal interface material 135 may be, for example, a thermal grease, a thermal gel or other organic type thermal interface material. It may also be possible to use a solder type thermal interface material if the surface 130 of the interposer 50 is provided with a film or films that will wet to a solder. Any suitable applicator 143 may be used. Even some form of a preform could be used.

As an added refinement, the interposer 50 provides a cushion against potential warpage of the semiconductor chip 20 and/or the semiconductor chip 15. The positioning of the thin portion 90 and the adhesives 115 and 127 provide support and fill to accommodate chip warpage.

Figure 3:
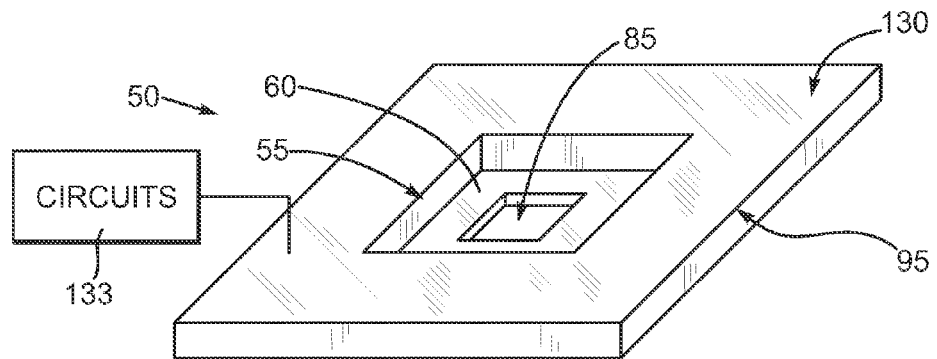
FIG. 3 is a pictorial view of an exemplary embodiment of thermal management interposer.

Additional details of the interposer 50 may be understood by referring now to FIG. 3, which is a pictorial view. Here, the seating surface 60, the aperture 55, the aperture 85, the upper surface 130 and the thickened portion 95 are clearly visible. In this illustrative embodiment, the apertures 55 and 85 may be generally rectangular, however a variety of different types of shapes may be used for the apertures 55 and 85 as desired. The interposer 50 may be composed of a variety of materials suitable for use in a stacked semiconductor chip arrangement. Some desirable properties include, for example, a coefficient of thermal expansion that is relatively close to the CTE's of the semiconductor chips 15 and 20, ease of manufacture, and thermal conductivity. Exemplary materials include, for example, silicon, germanium, sapphire, diamond, carbon nanotubes in a polymer matrix, or the like. A variety of material forming techniques may be used to manufacture the interposer 50. For example, the apertures 55 and 85 may be formed in the interposer 50 by way of well-known lithographic patterning and etching techniques. Optionally, laser ablation may be used to form the apertures. The actual footprint of the interposer 50 may be provided by way of dicing by mechanical sawing, laser sawing or even high pressure water jet cutting. Furthermore, it should be understood that the interposer 50 may be fabricated on a wafer scale or on an individual basis as desired. It is possible to implement circuits 133, represented by the schematic box, in the interposer to perform functions via electrons and/or photons.

An exemplary method of assembling the semiconductor chip device 10 may be understood by referring again to FIGS. 1 and 2. Prior to attachment of the lid 30 to the circuit board 25, the semiconductor chip may be flip-chip mounted to the circuit board 25 and electrically connected thereto by way of the interconnect structures 40. This step may entail a reflow step in the event that the interconnect structures 40 are composed entirely or partially of solder. Next, the underfill material layer 45 may be introduced between the semiconductor chip 20 and the circuit board 25. However, this step could be delayed until later in the process. Next, a suitable non-conductive adhesive 115 (FIG. 2) may be applied to the semiconductor chip 20 and the interposer seated on the adhesive 115. Next, the semiconductor chip 15 may be seated on the seating surface 60 of the interposer and connected electrically to the semiconductor chip 20 by the interconnect structures 80. Again, depending upon the exact composition of the interconnect structures 80, this step may entail a solder reflow process in the event that the interconnect structures 80 are composed entirely or partially of some type of solder material. Furthermore, the optional adhesive 127 may be applied to the seating surface 60 of the interposer 50 prior to the placement of the semiconductor chip 15 as desired. Next, the thermal interface material 65 is brought into contact with the semiconductor chip 15 and in particular the back side metallization structure 75 thereof. This step may be performed by placing the thermal interface material 65 on the chip 15 and thereafter dropping the lid 30 in place or by way of placing a preform of interface material on the lid 30 first and then dropping the lid 30 into position. Again, a thermal interface material may be optionally placed on the surface 130 of the interposer 50 at this stage if desired. Finally, the lid 30 may be positioned on the circuit board 25 by way of the adhesive and a suitable curing process may be performed in order to set the adhesive 35 and if desired reflow the thermal interface material 65 in the event that a solder material is used.

Figure 4:
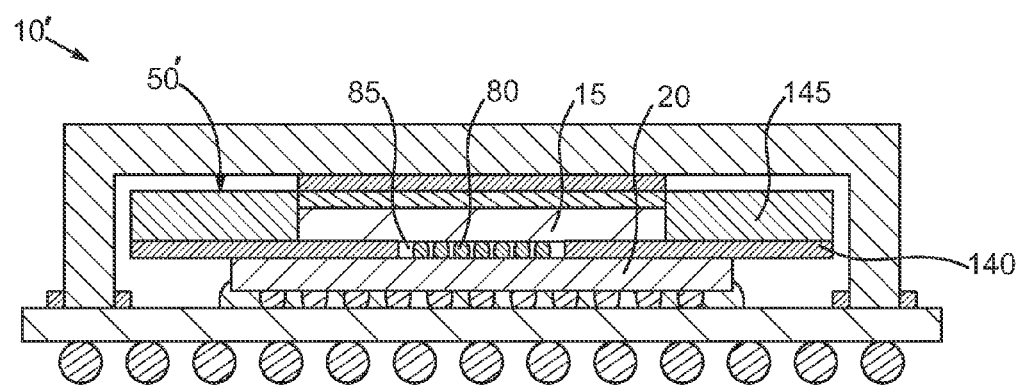
FIG. 4 is a sectional view of an alternate exemplary embodiment of a semiconductor chip device that incorporates stacked semiconductor chips.

An alternate exemplary embodiment of a semiconductor chip device 10' may be understood by referring now to FIG. 4, which is a sectional view. Here, the semiconductor chip device 10' may be substantially identical to the semiconductor chip device 10 depicted in FIGS. 1, 2 and 3 and described elsewhere herein with a notable exception. In this illustrative embodiment, the semiconductor chip device 10' may include the stacked semiconductor chips 15 and 20 and an interposer 50' that functions like the interposer 50 described elsewhere herein. However, the interposer 50' in this illustrative embodiment is not an integral piece, but instead the combination of a base member 140 and a frame member 145 mounted thereon and secured thereto by way of an adhesive or other joining technique. The base member 140 may be provided with the aperture 85 to facilitate the spatial arrangement of interconnect structures 80 between the semiconductor chip 15 and the semiconductor chip 20.

Figure 5:
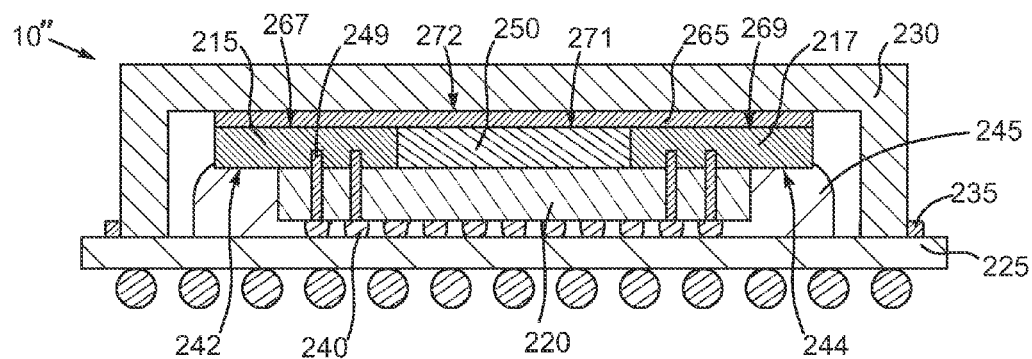
FIG. 5 is a sectional view of another alternate exemplary embodiment of a semiconductor chip device that incorporates stacked semiconductor chips.

Another alternate exemplary embodiment of a semiconductor chip device 10" may be understood by referring now to FIG. 5, which is a sectional view. In this illustrative embodiment, two semiconductor chips 215 and 217 are stacked with a third semiconductor chip 220. The semiconductor chip 220 is mounted to a circuit board 225 which may be configured like the circuit board 25 described elsewhere herein. A lid 230 configured like the lid 30 described elsewhere herein may be used to provide a heat spreader for the semiconductor chips 215, 217 and 220 and may be secured to the circuit board by way of an adhesive 235. The semiconductor chip 220 may be electrically interfaced with the circuit board 220 by way of interconnect structures 240, which may be substantially like the two interconnect structures 40 described elsewhere herein. To lessen the effects of differential CTE, an underfill material layer 245 may be interposed between not only the semiconductor chip 220 and the circuit board 225 but also beneath overhanging portions 242 and 244 of the semiconductor chips 215 and 217. The semiconductor chips 215 and 217 may be interfaced electrically with the semiconductor chip 220 and/or the interconnect structures 240 by way of thru-silicon vias 249, or various other types of interconnect structures as desired. To provide for thermal management of heat dissipated by not only the semiconductor chip 220 but also the semiconductor chips 215 and 217 stacked thereon, an interposer 250 may be seated on the semiconductor chip 220 and nested around the semiconductor chips 215 and 217. Because of the location of the section for FIG. 5, only a small portion of the interposer 250 is actually visible. A thermal interface material 265 is provided between the upper surfaces 267 and 269 of the semiconductor chips 215 and 217 and the upper surface 271 of the interposer 250 and the lower surface 272 of the lid 230. Thermal interface material 265 may be a thermal gel, a thermal grease, a solder or the like. If a solder is selected, exemplary materials include indium, indium solder, tin-silver, bismuth-tin, other tin solders, gallium plus a polymer or the like. If a solder type thermal interface material is contemplated, then the upper surfaces of the semiconductor chips 215 and 217 as well as the upper surface of the interposer 250 may be provided with some form of backside metallization that facilitates solder wetting. Note that the same general assembly techniques described above in conjunction with FIG. 1 may be used to assemble the semiconductor chip device 10".

Figure 6:
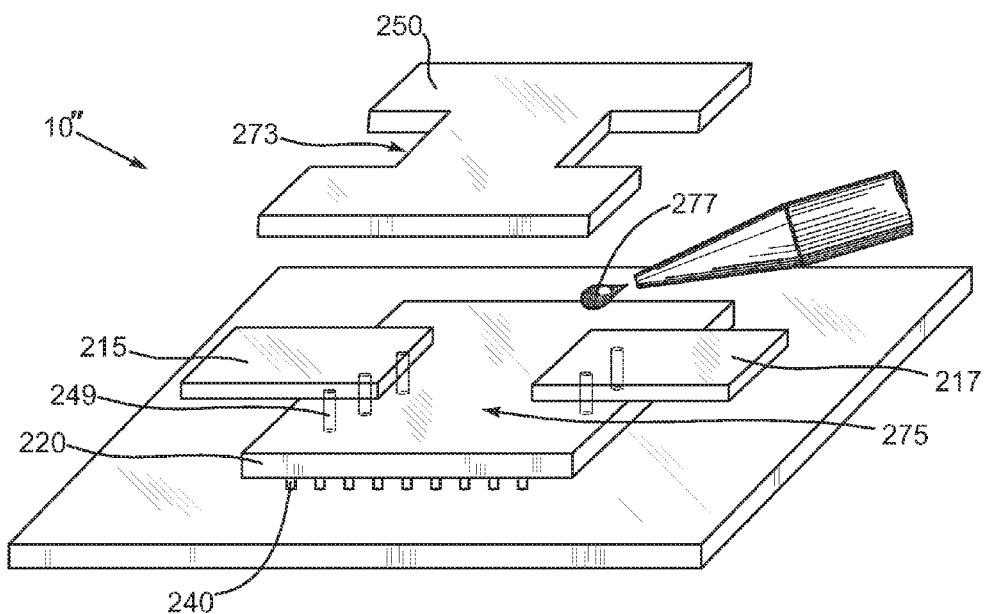
FIG. 6 is a partially exploded pictorial view of a portion of the device depicted in FIG. 5.

Additional details of the semiconductor chip device 10" may be understood by referring now also to FIG. 6, which is a partially exploded pictorial view of the semiconductor chip device 10" but without the lid 230 or the thermal interface material 265 in place. In addition, the interposer 250 is shown exploded from the semiconductor chip 220. Note that a few features depicted in FIG. 5 are visible in FIG. 6 as well, such as the interconnect structures 240 that electrically interface the semiconductor chip 220 to the circuit board 225 as well as the thru-silicon vias 249 that electrically link the semiconductor chips 215 and 217 to either the circuit board 225 or the semiconductor chip 220 or both. As noted above, only a portion of the interposer 250 is actually visible in FIG. 5, namely, the portion generally at the location 273 in FIG. 6. In this illustrative embodiment, the semiconductor chip 215 and 217 cover only a portion of the semiconductor chip 220 and thus leave a portion 275 uncovered. The interposer 250 is fabricated with a footprint that is designed to cover some or all of the uncovered portion 275 without extending beyond the footprint or lateral boundaries of the semiconductor chip 220. Because of the particular spatial arrangement of the semiconductor chips 215 and 217 on the semiconductor chip 220, the interposer 250 may be formed with a general I-beam like footprint as shown. In this way, the portions of the upper surface of the semiconductor chip 220 not occupied by the semiconductor chips 215 and 217 may be covered by the interposer 250 and thus provide a continuous thermal pathway between the semiconductor chip 220 and the overlying thermal interface material layer 265 depicted in FIG. 5. However, in the event that only a single semiconductor chip, say the chip 215, is mounted on the semiconductor chip 220, then the interposer 250 could have a U-shaped footprint for example.

The interposer 250 may be composed of, for example, silicon, germanium, sapphire or the like. A variety of material forming techniques may be used to manufacture the interposer 250, such as well-known lithographic patterning and etching techniques. Optionally, dicing by mechanical sawing, laser sawing or even high pressure water jet cutting. Furthermore, it should be understood that the interposer 50 may be fabricated on a wafer scale or on an individual basis as desired. Here, a suitable non-conductive adhesive 277 may be applied to the interface between the semiconductor chip 220 and the interposer 250. The non-conductive adhesive 277 facilitates not only a mechanical fastening but also serves to lower the thermal resistance between the interposer 215 and the semiconductor chip 220. The non-conducting adhesive may be advantageously composed of some form of non-conducting polymer material. Various epoxies or other polymers may be used, such as benzocyclobutene (BCB).

Figure 7:
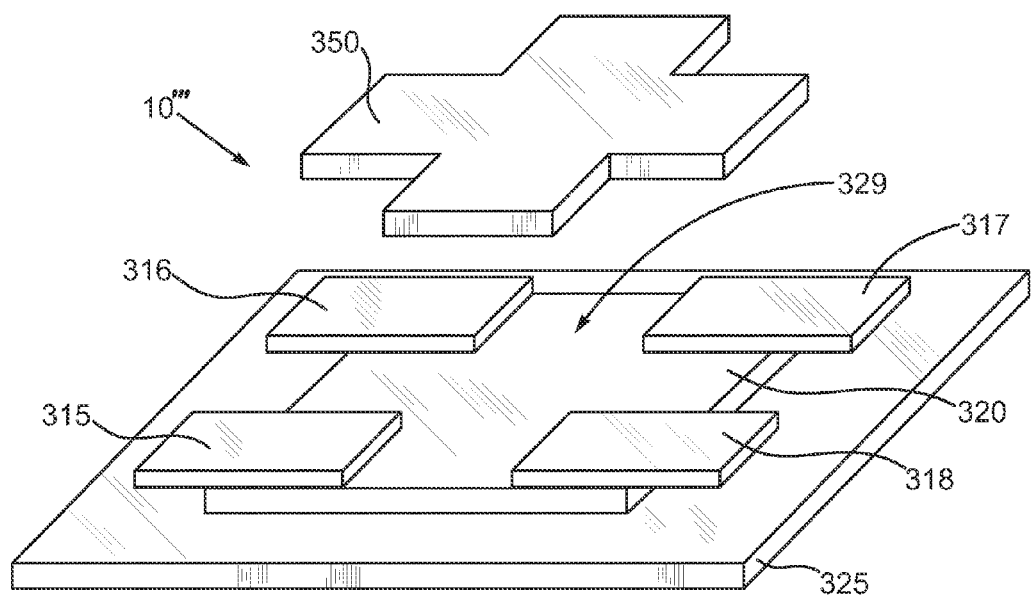
FIG. 7 is a partially exploded pictorial view like FIG. 6, but of an alternate exemplary embodiment of a semiconductor chip device utilizing stacked semiconductor chips.

In the illustrative embodiment depicted in FIGS. 5 and 6, two semiconductor chips 215 and 217 are mounted on a third semiconductor chip 220. However, the skilled artisan will appreciate that the number of semiconductor chips that may be stacked on a given semiconductor chip may be more than two and arranged in other than as depicted in FIGS. 5 and 6. In this regard, attention is now turned to FIG. 7, which is a partially exploded view of a semiconductor chip device 10''' that includes four semiconductor chips 315, 316, 317 and 318 mounted on a semiconductor chip 320. The semiconductor chip 320 is, in turn, mounted to a circuit board 325 which may be configured as generally described elsewhere herein for the other illustrative embodiments. Here again, the thermal interface material and lid are not depicted. In this illustrative embodiment, the semiconductor chips 315, 316, 317 and 318 may be mounted at the corners 327a, 327b, 327c, and 327d, of the semiconductor chip 320 and with overhangs relative to the semiconductor chip 320 so as to form a cross-shaped exposed area 329 of the semiconductor chip 320. An interposer 350 may be seated on the cross-shaped exposed portion 329 of the semiconductor chip 320 to provide a low thermal resistance pathway between the semiconductor chip 320 and an overlying heat spreader such as embodied by the heat spreader 230 for example in FIG. 5. The interposer 350 may be composed of the same types of materials described elsewhere herein for the other illustrative interposers and manufactured using the same general types of techniques.

Figure 8:
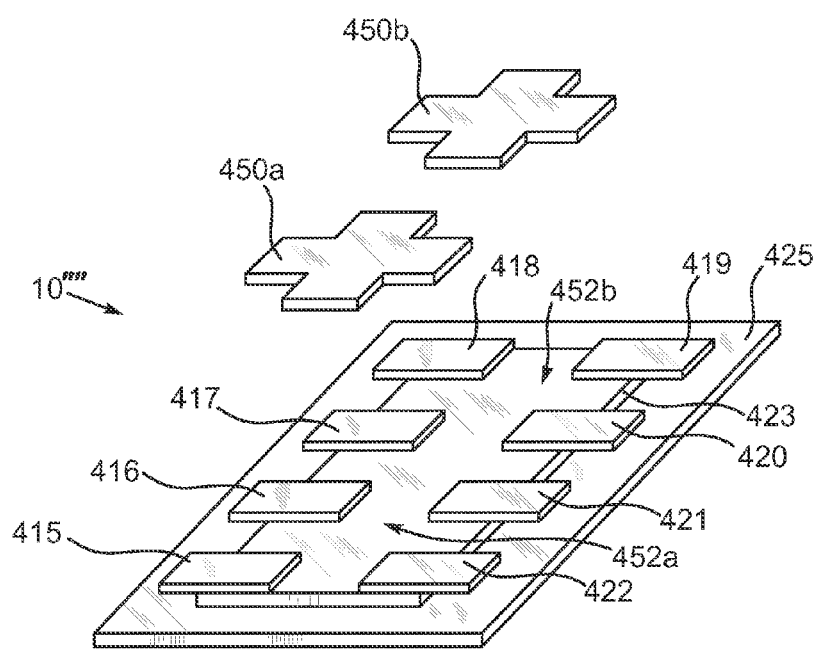
FIG. 8 is a partially exploded pictorial view like FIG. 7, but of another alternate exemplary embodiment of a semiconductor chip device utilizing stacked semiconductor chips.

In still another alternate exemplary embodiment, multiple interposers may be used to provide thermal pathways between a semiconductor chip and a heat spreader of one form or another in a stacked chip arrangement. In this regard, attention is now turned to FIG. 8 which is a partially exploded view of a semiconductor chip device 10'''' that includes eight semiconductor chips 415, 416, 417, 418, 419, 420, 421 and 422 mounted on a semiconductor chip 423. Again, a thermal interface material and lid are not shown. The semiconductor chip 423 may be in turn mounted to a circuit board 425 of the types described elsewhere herein. Two interposers 450a, and 450b, may be seated on the exposed portions 452a, and 452b, of the semiconductor chip 423 to provide a thermal pathway between the semiconductor chip 423 and an overlying heat spreader (not shown) but of the type generally illustrated in conjunction with element 230 in FIG. 5. Due to the spatial arrangement of the semiconductor chips 415, 416, 417, 418, 419, 420, 421 and 422 the interposers 450a, and 450b, may be provided with the cross-shaped footprints as depicted. However, the skilled artisan will appreciate that virtually any type of spatial arrangement of semiconductor chips on an underlying semiconductor chip may be accommodated by a correspondingly shaped interposer. The interposers 450a, and 450b, may be composed of the same materials described in conjunction with the other disclosed embodiments and fabricated in the same manners.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of assembling a semiconductor chip device, comprising:
   placing an interposer on a first semiconductor chip, the interposer including a lower surface seated on the first semiconductor chip and an upper surface adapted to thermally contact a heat spreader, the upper surface including a first aperture defining a seating surface facing away from the lower surface; and
   placing a second semiconductor chip in the first aperture.

2. The method of claim 1, comprising electrically coupling the second semiconductor chip to the first semiconductor chip.

3. The method of claim 2, wherein the interposer comprises a second aperture contiguous with the first aperture and leading to the first semiconductor chip, the method comprising electrically coupling second semiconductor chip to the first semiconductor chip by plural interconnect structures positioned in the second aperture.

4. The method of claim 1, comprising placing a heat spreader in thermal contact with the interposer and the second semiconductor chip.

5. The apparatus of claim 4, comprising positioning a thermal interface material between the second semiconductor chip and the heat spreader.

6. An apparatus, comprising:
   a first semiconductor chip;
   an interposer including a lower surface seated on the first semiconductor chip and an upper surface adapted to thermally contact a heat spreader, the upper surface including a first aperture defining a seating surface facing away from the lower surface; and
   a second semiconductor chip positioned in the first aperture.

7. The apparatus of claim 6, wherein the second semiconductor chip is electrically coupled to the first semiconductor chip.

8. The apparatus of claim 7, wherein the interposer comprises a second aperture contiguous with the first aperture and leading to the first semiconductor chip, the second semiconductor chip being electrically coupled to the first semiconductor chip by plural interconnect structures positioned in the second aperture.

9. The apparatus of claim 6, comprising a heat spreader in thermal contact with the interposer and the second semiconductor chip.

10. The apparatus of claim 6, comprising a thermal interface material positioned between the second semiconductor chip and the heat spreader.

11. The apparatus of claim 6, wherein the interposer comprises a substantially planar substrate.

12. The method of claim 1, comprising stacking a third semiconductor chip on the second semiconductor chip.

13. The method of claim 1, comprising mounting the first semiconductor chip on a circuit board.

14. The apparatus of claim 6, comprising a third semiconductor chip stacked on the second semiconductor chip.

15. The apparatus of claim 6, comprising a circuit board, the first semiconductor chip being mounted on the circuit board.

16. A method of assembling a semiconductor chip device, comprising:
   placing an interposer on a first semiconductor chip, the interposer including a lower surface seated on the first semiconductor chip and an upper surface adapted to thermally contact a heat spreader, the upper surface including a first aperture, the first aperture defining a thinned portion of the interposer having a seating surface; and
   placing a second semiconductor chip in the first aperture on the seating surface.

17. The method of claim 16, wherein the interposer includes a second aperture extending through the thinned portion.

* * * * *